United States Patent
Yang et al.

(10) Patent No.: US 8,802,563 B2
(45) Date of Patent: Aug. 12, 2014

(54) SURFACE REPAIR STRUCTURE AND PROCESS FOR INTERCONNECT APPLICATIONS

(75) Inventors: Chih-Chao Yang, Glenmont, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,051

(22) Filed: Sep. 4, 2012

(65) Prior Publication Data

US 2012/0329270 A1 Dec. 27, 2012

Related U.S. Application Data

(62) Division of application No. 12/247,568, filed on Oct. 8, 2008.

(51) Int. Cl.
*H01L 21/44* (2006.01)

(52) U.S. Cl.
USPC ........... 438/652; 438/622; 438/631; 438/637; 438/653; 438/687; 257/750; 257/E23.168

(58) Field of Classification Search
USPC .......... 257/750, E23.168; 438/622, 631, 637, 438/652, 653, 687
See application file for complete search history.

(56) References Cited

U.S. PATENT DOCUMENTS

| | | | |
|---|---|---|---|
| 4,707,391 A | 11/1987 | Hoffmann, Sr. | |
| 4,948,431 A | 8/1990 | Strickland et al. | |
| 5,298,099 A | 3/1994 | Hoffmann, Sr. | |
| 6,030,298 A | 2/2000 | Tate | |
| 6,050,905 A | 4/2000 | Tate | |
| 6,143,095 A | 11/2000 | Kim et al. | |
| 6,231,949 B1 | 5/2001 | Hoffmann, Sr. | |
| 6,358,832 B1 * | 3/2002 | Edelstein et al. | 438/612 |
| 6,403,466 B1 * | 6/2002 | Lopatin | 438/627 |
| 6,465,376 B2 | 10/2002 | Uzoh et al. | |
| 6,582,579 B1 | 6/2003 | Uzoh | |
| 6,627,292 B1 | 9/2003 | Hoffmann, Sr. | |
| 6,887,836 B2 | 5/2005 | Majeti et al. | |
| 7,069,830 B1 | 7/2006 | Meyer | |
| 7,074,719 B2 | 7/2006 | Kim et al. | |
| 7,190,079 B2 | 3/2007 | Andricacos et al. | |
| 7,220,454 B2 | 5/2007 | Barron et al. | |

(Continued)

OTHER PUBLICATIONS

Office Action dated Jan. 7, 2013 received in the parent U.S. Appl. No. 12/247,568.

(Continued)

*Primary Examiner* — Zandra Smith
*Assistant Examiner* — Jamie C Niesz
(74) *Attorney, Agent, or Firm* — Scully, Scott, Murphy & Presser, P.C.; Louis J. Percello

(57) ABSTRACT

A method is provided which includes providing a dielectric material having a dielectric constant of about 4.0 or less and at least one conductive material embedded therein, the at least one conductive material has an upper surface that is coplanar with an upper surface of the dielectric material and the upper surface of the at least one conductive material has hollow-metal related defects that extend inward into the at least one conductive material; and filling the hollow-metal related defects with a surface repair material.

16 Claims, 3 Drawing Sheets

(56) References Cited

U.S. PATENT DOCUMENTS

| | | |
|---|---|---|
| 7,253,103 B2 | 8/2007 | Iwasaki et al. |
| 7,265,048 B2 | 9/2007 | Chung et al. |
| 7,273,048 B1 | 9/2007 | Zuzelo |
| 7,396,762 B2 | 7/2008 | Hsu et al. |
| 7,400,043 B2 | 7/2008 | Wai et al. |
| 2003/0069668 A1 | 4/2003 | Zurn |
| 2003/0089928 A1 | 5/2003 | Saito et al. |
| 2004/0035709 A1* | 2/2004 | Uzoh ............................. 205/123 |
| 2004/0084773 A1 | 5/2004 | Johnston et al. |
| 2004/0236424 A1 | 11/2004 | Berez et al. |
| 2005/0131128 A1 | 6/2005 | Hughes et al. |
| 2005/0167841 A1 | 8/2005 | Papa Rao et al. |
| 2005/0234461 A1 | 10/2005 | Burdulis, Jr. et al. |
| 2005/0267584 A1 | 12/2005 | Burdulis, Jr. et al. |
| 2006/0113675 A1* | 6/2006 | Chang et al. .................. 257/763 |
| 2006/0252252 A1* | 11/2006 | Zhu et al. ...................... 438/618 |
| 2007/0179608 A1 | 8/2007 | Ek et al. |
| 2007/0198022 A1 | 8/2007 | Lang et al. |
| 2007/0250169 A1 | 10/2007 | Lang |
| 2007/0273044 A1 | 11/2007 | Yang et al. |
| 2008/0197499 A1 | 8/2008 | Yang et al. |
| 2008/0299718 A1 | 12/2008 | Jiang et al. |
| 2010/0081274 A1 | 4/2010 | Ishizaka et al. |

OTHER PUBLICATIONS

Office Action dated Sep. 11, 2013 received in the parent U.S. Appl. No. 12/247,568.

* cited by examiner

SURFACE REPAIR STRUCTURE AND PROCESS FOR INTERCONNECT APPLICATIONS

RELATED APPLICATION

This application is a divisional of U.S. Ser. No. 12/247,568, filed Oct. 8, 2008, the entire contents of which are incorporated herein by reference.

FIELD OF THE INVENTION

The present invention relates to semiconductor interconnect structures, and methods of fabricating the same. More particularly, the present invention relates to semiconductor interconnect structures having enhanced electromigration (EM) resistance in which a decrease in in-line defect related yield loss is observed.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

In view of the above, there is a need for providing interconnect structures having enhanced EM resistance.

SUMMARY OF THE INVENTION

The present invention provides semiconductor interconnect structures that have improved EM reliability. The present invention further provides semiconductor interconnect structures that include a surface-repair material that fills any hollow-metal related defects located within a conductive material of the inventive interconnect structure. As such, the inventive interconnect structures exhibit a decreased in in-line defect related yield loss. The present invention further provides interconnect structures that have better reliability and technology extendibility for the semiconductor industry.

In general terms, the present invention provides an interconnect structure including: a dielectric material having a dielectric constant of about 4.0 or less and at least one conductive material embedded therein, the at least one conductive material having an upper surface that is coplanar with an upper surface of the dielectric material and the upper surface of the at least one conductive material has hollow-metal related defects located therein; and a surface repair material located within and filling the hollow-metal related defects that are present at the upper surface of the at least one conductive material.

The surface repair material, which is embedded within the conductive material, includes any noble metal or noble metal alloy that is resistant to corrosion or oxidation. Preferably, the surface repair material includes one of Ru, Ir, Rh, Pt, Co, W and alloys thereof such as, for example, Co(W,P,B). It is observed that the surface repair material may comprise the same or different, preferably the same, noble metal material as an optional noble metal cap to be subsequently formed. When the same materials are used for the surface repair material and the noble metal cap there is no interface formed between these same materials. As such, the surface repair material and the noble metal cap could be considered as a single component of the interconnect structure which has unitary construction. When two different materials are used for the surface repair material and the noble metal cap, an interface exists between the surface repair material and the noble metal cap. As such, the surface repair material and the noble metal cap are separate and distinct components that are present in the inventive interconnect structure. Similarly, when a dielectric material is used as a capping layer directly on the interconnect structure and the embedded repair metal material surface, an interface exists between the surface repair material and the dielectric capping layer.

The dielectric material which is present in the inventive interconnect structure may be any interconnect dielectric material having a dielectric constant of about 4.0 or less.

Illustratively, the dielectric material employed in the present invention comprises silicon dioxide, a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as AlCu).

The inventive structure further includes a U-shaped diffusion barrier that separates the conductive material from the dielectric material. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

In some embodiments of the present invention, a dielectric capping layer is located above the inventive structure.

In yet other embodiments of the present invention, a noble metal cap is located on the surface of the at least one conductive material. When present, the noble metal cap does not extend onto the dielectric material. Preferably, the noble metal cap does not extend onto an upper surface of a U-shaped diffusion barrier that is present between the at least one conductive material and the dielectric material.

The term "noble metal" when referring to the cap located atop the at least one conductive material includes any metal that is resistant to corrosion or oxidation. The preferred noble metals that can be used in the present invention are selected from the group consisting of Ru, Ir, Rh, Pt, Co, W and alloys thereof. More preferably, the noble metal employed as the noble metal cap comprises Ru or a Ru alloy. In a preferred embodiment, the noble metal cap is self aligned to the underlying conductive material that is embedded within the dielectric material. That is, the noble metal cap preferably does not extend beyond the upper surface of the conductive material. In yet another embodiment, the noble metal cap extends onto an upper surface of a U-shaped diffusion barrier that separates the conductive material from the dielectric material. In no instance does the noble metal cap or residues thereof extend onto the dielectric material.

When a noble metal cap is present, the inventive interconnect structure also typically includes a dielectric capping layer.

In addition to the interconnect structures mentioned above, the present invention also provides a method of fabricating the same. In general terms, the inventive method includes: providing a dielectric material having a dielectric constant of about 4.0 or less and at least one conductive material embedded therein, the at least one conductive material has an upper surface that is coplanar with an upper surface of the dielectric material and the upper surface of the at least one conductive material has hollow-metal related defects that extend inward into the at least one conductive material; and filling said hollow-metal related defects with a surface repair material.

DETAILED DESCRIPTION OF THE INVENTION

The present invention, which provides interconnect structures having enhanced electromigration (EM) resistance and a decrease of in-line defect related yield loss and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1D:
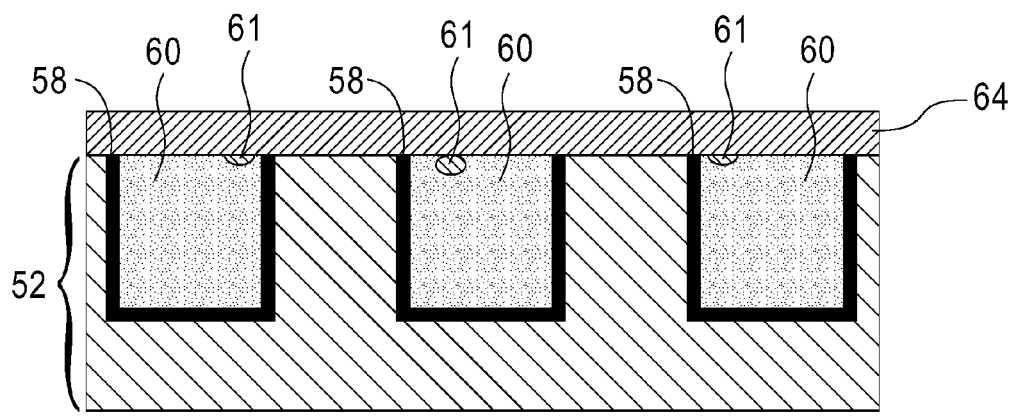
Figure 2:
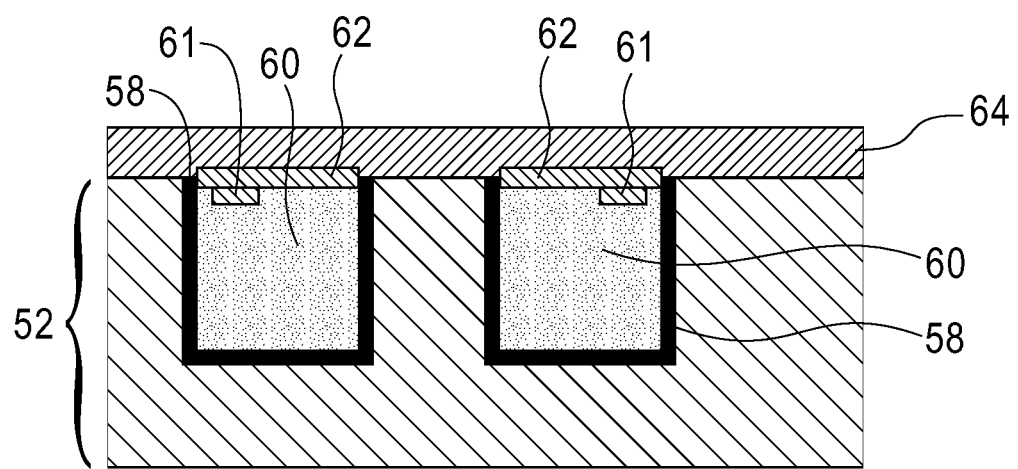
FIG. 2 is a pictorial representation (through a cross-sectional view) illustrating an alternative interconnect structure that can be formed in the present invention containing a noble metal cap.

As stated above, the present invention provides an interconnect structure (See, for example, FIG. 1D and FIG. 2) including a dielectric material having a dielectric constant of about 4.0 or less and having at least one conductive material embedded therein. The at least one conductive material has an upper surface that is coplanar with an upper surface of the dielectric material. The upper surface of the conductive material includes at least one hollow-metal related defect that extends inward into the at least one conductive material. A surface repair material is present within and filling the at least one hollow-metal related defect that is present at the surface of the at least one conductive material. Although partial filling of the hollow-metal related defects is contemplated, the present invention prefers complete filling of the defects with a surface repair material. In some embodiments, a dielectric capping layer (as shown in FIG. 1D) is present on the inventive interconnect structure. In another embodiment, as shown in FIG. 2, a noble metal cap and a dielectric capping layer are both present on the inventive interconnect structure.

The present invention also provides a method of fabricating interconnect structures in which the hollow-metal related defects located within the embedded conductive material are filled with a surface repair material. In general terms, the inventive method, which is illustrated, for example, in FIGS. 1A-1D, includes providing a dielectric material having a dielectric constant of about 4.0 or less and at least one conductive material embedded therein. The at least one conductive material has an upper surface that is coplanar with an upper surface of the dielectric material. Located at the surface of the at least one conductive material, and extending inwardly, is at least one hollow-metal related defect. Next, a surface repair material is filled into the at least one hollow-metal related defect. In some embodiments, a dielectric cap layer is then formed. In yet another embodiment, a noble metal cap and a dielectric cap are then formed.

Figure 1A:
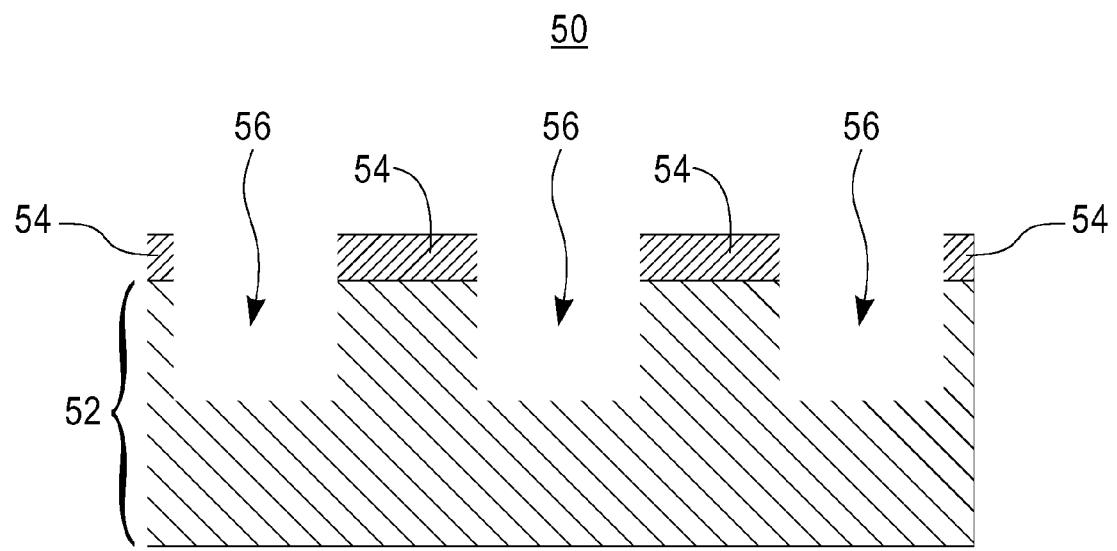
FIGS. 1A-1D are pictorial representations (through cross-sectional views) illustrating an interconnect structure that can be formed in the present invention containing a surface repair material within a hollow-metal related defect that is located at the surface of a conductive material embedded within an interconnect dielectric material.

Specifically, FIG. 1A illustrates an initial structure 50 that can be employed in the present invention in fabricating the inventive interconnect structure. The initial structure 50 includes a dielectric material 52 having a pad stack 54 located on an upper surface thereof. As shown, the initial structure 50 also includes at least one opening 56 that is located within the pad stack 54 and the dielectric material 52.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to silicon dioxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 4.0 or less, with a dielectric constant of about 3.8 or less being more typical, and with a dielectric constant of less than 2.8 being even more typical. All dielectric constants mentioned herein are relative to a vacuum, unless otherwise noted. Dielectrics having a dielectric constant of less than 4.0 are preferred since these dielectrics generally have a lower parasitic cross talk as compared with dielectric materials that have a higher dielectric constant. The thickness of the dielectric material 52 may vary depending upon the dielectric material used as well as the exact number of dielectric layers within the dielectric material 52. Typically, and for normal interconnect structures, the dielectric material 52 has a thickness from 50 nm to 1000 nm.

The dielectric material 52 is formed by blanket depositing an interconnect dielectric material across the substrate utilizing any conventional deposition process including, but not limited to chemical vapor deposition (CVD), plasma enhanced chemical vapor deposition (PECVD), evaporation, chemical solution deposition and spin-on coating. After forming the dielectric material, pad stack 54 is formed on an exposed upper surface of dielectric material 52. The pad stack 54 comprises any pad stack material including, for example, an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition (ALD). In other embodiments, the pad stack 54 is formed by a thermal process such as, for example, a thermal oxidation, a thermal nitridation and/or a thermal oxynitridation process. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from 10 nm to 80 nm.

After forming the dielectric material 52 and the pad stack 54, the at least one opening 56 is formed into the dielectric material 52 utilizing the pad stack 54 as a pattern mask. The at least one opening 56 may include a via opening, a line opening, a combined via and line opening, or any combination thereof. In the drawings, three line openings are shown by way of a non-limiting example.

The at least one opening 56 is formed utilizing conventional lithography and etching. The lithographic step includes forming a photoresist (organic, inorganic or hybrid) atop the blanket layer of pad stack material utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process. After the development step, an etching step is performed to transfer the pattern from the patterned photoresist into pad stack 54 and then into the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof. Typically, reactive ion etching is used to form the at least one opening 56.

Figure 1B:
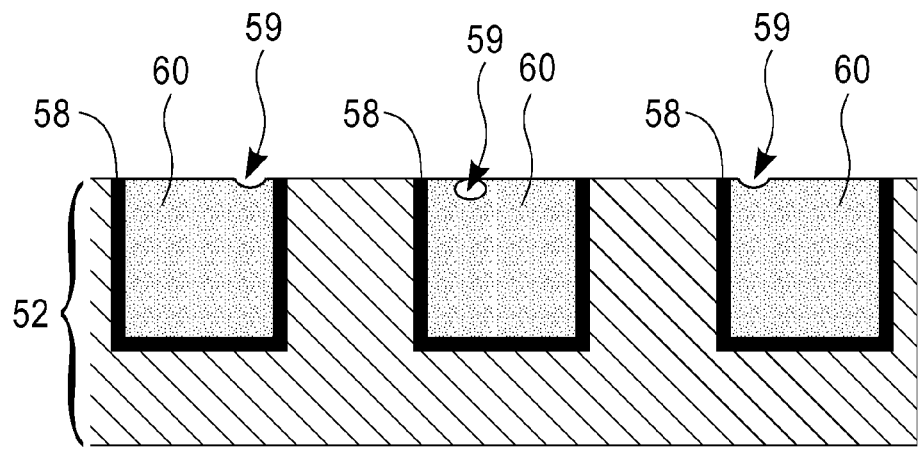

Next, and as shown in FIG. 1B, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from 4 nm to 40 nm, with a thickness from 7 nm to 20 nm being more typical.

The diffusion barrier 58, which is located between the conductive material 60 and the dielectric material 52 is formed by any conventional deposition process including, for example, CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 1B in which the upper surfaces of the dielectric material 52, the diffusion barrier 58 (which is now U-shaped) and the conductive material 60 are substantially coplanar with each other. It is noted that during the planarization process, the patterned pad stack 54 is removed from the structure.

In some embodiments of the invention, and during the processing steps mentioned above, hollow-metal related defects 59 are formed at the upper surface of the conductive material 60. The hollow-metal related defects 59 can be formed by poor patterning, metallization and/or planarization.

In some embodiments, the hollow-metal related defects 59 are intentionally formed into the conductive material by utilizing one of wet chemical etching and dry etching. Preferably, a wet chemical etchant such as, for example, dilute hydrofluoric (HF) acid can be used to intentionally form the defects within the conductive material 60. The intentional formation of hollow-metal related defects 59 within the conductive material 60, at a first glance, appears to be unwarranted. However, applicants have determined that by intentionally forming the hollow-metal related defects and then filling the same with the surface repair material improved EM resistance of the interconnect structure can be achieved.

The term "hollow-metal related defects" as used throughout the present application denotes defects that appear on the interconnect surface post planarization. This type of "feature" could either come from process defects or are created intentionally, as mentioned above. As shown, the hollow-metal related defects 59 are located at the surface of the conductive material 60. As also shown, the hollow-metal defects 59 protrude inward into the conductive material 60.

Figure 1C:
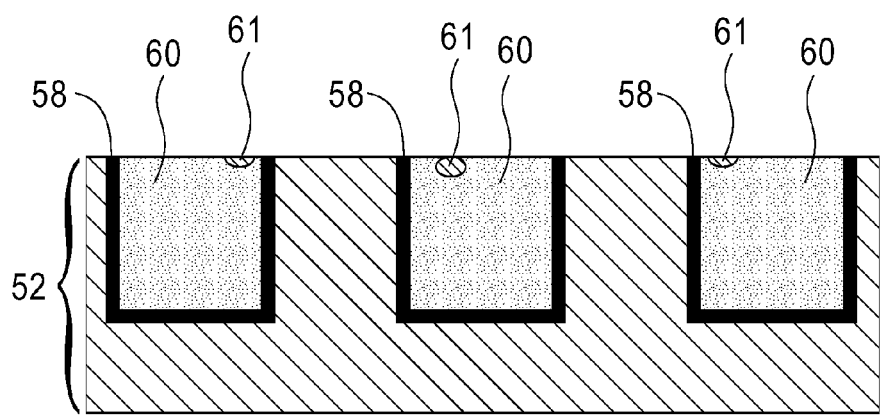

Next, and as shown in FIG. 1C, a surface repair material 61 is provided filling each of the hollow-metal related defects 59. The surface repair material 61 includes any noble metal or noble metal alloy that is resistant to corrosion or oxidation. Preferably, the surface repair material includes one of Ru, Ir, Rh, Pt, Co, W and alloys thereof such as, for example, Co(W, P,B). It is observed that the surface repair material 61 may comprise the same or different, preferably the same, noble metal material as an optional noble metal cap to be subsequently formed.

The filling of the hollow-metal related defects 59 with a surface repair material 61 is performed by a low temperature chemical deposition process including, for example, CVD, PECVD, low pressure CVD and ALD. By "low temperature", it is meant a deposition temperature of about 200° C. or less, with a deposition temperature of less than about 150° C. being even more preferred. The deposition conditions are selected to provide a deposition rate of the continuous noble metal-containing cap onto the conductive material 60 that is from 0.2 to 1.2 Å/sec.

Alternatively, the filling of the hollow-metal related defects 59 with a surface repair material 61 may be performed by electroless plating or by electroplating. Electroplating is a process of using electrical current to reduce cations of a desired material, e.g., a noble metal, from a solution and coat a conductive object, e.g., the at least one conductive material, with a thin layer of the material, e.g., the noble metal. In electroless plating, a redox reaction involving the oxidation of one or more soluble reducing agents such as, for example, hypophosphite, and the reduction of one or metallic ions, e.g., noble metal ions, occurs on the surface of a substrate, e.g., the at least one conductive material.

After filling the hollow-metal related defects 59 with a surface repair material 61, a dielectric capping layer 64 is formed across the entire structure shown in FIG. 1C. The resultant structure including the dielectric capping layer 64 is shown, for example, in FIG. 1D. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof.

The thickness of the dielectric capping layer 64 may vary depending on the technique used to form the same as well as the material make-up of the layer. Typically, the dielectric capping layer 64 has a thickness from 15 nm to 100 nm, with a thickness from 25 nm to 45 nm being more typical.

The dielectric capping layer 64 is formed utilizing any conventional deposition process including, for example, CVD, PECVD, evaporation, spin-on coating and chemical solution deposition.

FIG. 1D illustrates an interconnect structure in accordance with an embodiment of the present invention. Specifically, the inventive interconnect structure includes a dielectric material 52 having a dielectric constant of about 4.0 or less. The dielectric material 52 has at least one conductive region (represented by conductive material 60) embedded within the dielectric material 52, said at least one conductive region having an upper surface that is coplanar with an upper surface of the dielectric material 52. In some embodiments, and during the fabrication of the interconnect structure, hollow-metal related defects 59 are introduced into the conductive material 60. In other embodiments, such defects are intentionally formed via an etching process. In prior art structures, these defects typically remain in the structure. In the inventive structure, the defects within the conductive material are filled with a surface repair material 61. A dielectric capping layer 64 may be formed atop the inventive interconnect structure.

FIG. 2 illustrates an alternative interconnect structure that can be formed in the present invention. The alternative interconnect structure of FIG. 2 is essentially the same as the interconnect structure shown in FIG. 1D, except that a noble metal cap 62 is also present. The noble metal cap, which is formed prior to the formation of the dielectric capping layer 64, is selectively formed atop the conductive material 60. As shown, no noble metal cap 62 extends onto the surface of the dielectric material 52, preferably no noble metal cap 62 extends onto an upper surface of the U-shaped diffusion barrier 58.

The term "noble metal" when referring to the cap 62 located atop the at least one conductive region (i.e., conductive material 60) includes any metal that is resistant to corrosion or oxidation. The preferred noble metals that can be used in the present invention as the noble metal cap 62 are selected from the group consisting of Ru, Ir, Rh, Pt, Co, W and alloys thereof. More preferably, the noble metal employed as the noble metal cap comprises Ru or a Ru alloy. In some embodiments, the noble metal cap 62 is comprised of a multilayered noble metal or noble metal alloy stack. It is noted that the noble metal cap 62 may comprise the same or different, preferably the same, noble metal material as the surface repair material 61.

The thickness of the noble metal cap 62 may vary depending on the type of noble metal present in the cap, the deposition technique and conditions used as well as the number of noble metals within the cap. Typically, the noble metal cap 62 has a thickness from about 1 to about 100 Å, with a thickness from about 5 to about 50 Å being more highly preferred.

The noble metal cap 62 is formed utilizing a low temperature chemical deposition process including, for example, CVD, PECVD, low pressure CVD and ALD. By "low temperature", it is meant a deposition temperature of about 200° C. or less, with a deposition temperature of less than about 150° C. being even more preferred. The deposition conditions are selected to provide a deposition rate of the noble metal cap 62 onto the conductive material 60 that is from about 0.2 to about 0.8 Å/sec. It is noted that the above provides one technique used to form the noble metal cap selectively atop the conductive material. Although such an embodiment is specifically illustrated, the present invention also contemplates using other prior art techniques to selectively deposit the noble metal cap.

It should be noted that the surface repair material and the noble metal cap can be formed in a single step or in two steps. Two steps are preferred when the surface repair material and the noble metal cap are comprised of different materials. Also, two steps are preferred to ensure the complete and ideal filling of the hollow-metal related defects and the formation of a noble metal cap that has a substantially coplanar upper surface. If a single step is used to form both the surface repair material and the noble metal cap, incomplete filling of the defect may occur and/or the upper surface of the noble metal cap may not be coplanar.

As stated above, when the same materials are used for the surface repair material and the noble metal cap there is no interface formed between these same materials. As such, the surface repair material and the noble metal cap could be considered as a single component of the interconnect structure which has unitary construction. When two different materials are used for the surface repair material and the noble metal cap, an interface exists between the surface repair material and the noble metal cap. As such, the surface repair material and the noble metal cap are separate and distinct components that are present in the inventive interconnect structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating an interconnect structure comprising:

forming a pad stack on a surface of a dielectric material, said dielectric material having a dielectric constant of about 4.0 or less;

providing at least one opening through said pad stack and into a portion of said dielectric material;

forming a diffusion barrier and at least one conductive material within said at least one opening and on an upper surface of the pad stack, wherein said at least one conductive material is selected from a conductive metal, an alloy including at least two conductive metals and a conductive metal silicide;

removing a portion of the diffusion barrier atop said pad stack, a portion of said at least one conductive material atop said pad stack and said pad stack by planarization, wherein a remaining portion of said diffusion barrier and a remaining portion of the at least one conductive material within the at least one opening each has an upper surface that is coplanar with an upper surface of the dielectric material;

intentionally forming hollow-metal related defects at an upper surface of said at least one conductive material and that extend inward into the at least one conductive material, wherein said intentionally forming said hollow-metal related defects occurs after and separate from said planarization by utilizing an etching process selected from wet etching and dry etching; and filling said hollow-metal related defects with a surface repair material selected from a metal or metal alloy, wherein said filling of said hollow-metal related defects provides said surface repair material having an uppermost surface that is coplanar with said uppermost surface of the at least one conductive material and said upper surface of the dielectric material.

2. The method of claim 1 wherein said filling the hollow-metal related defects with the surface repair material includes selecting one of Ru, Co, Rh, Pt, W, and Ir as said surface repair material.

3. The method of claim 1 wherein said filling the hollow-metal related defects with the surface repair material includes selecting an alloy of Co(W,P,B) as said surface repair material.

4. The method of claim 1 wherein said filling the hollow-metal defects comprises a deposition selected from the group consisting of chemical vapor deposition (CVD), plasma enhanced chemical vapor deposition (PECVD), and atomic layer deposition (ALD).

5. The method of claim 4 wherein said deposition is performed at a temperature of 200° C. or less.

6. The method of claim 4 wherein said deposition is performed at a temperature of 150° C. of less.

7. The method of claim 1 wherein said filling the hollow-metal related defects includes electroless plating or electroplating.

8. The method of claim 1 further comprising forming a dielectric capping layer on the upper surface of the at least one conductive material, an upper surface of the surface repair material and the upper surface of the dielectric material.

9. The method of claim 1 further comprising forming a noble metal cap on the upper surface of said at least one conductive material, said noble metal cap does not extend onto the upper surface of the dielectric material.

10. The method of claim 9 further comprising forming a dielectric capping layer on the upper surface of the dielectric material as well as atop the noble metal cap.

11. The method of claim 1 wherein said at least one opening is a line opening, a via opening, a combined line opening and via opening or any combination thereof.

12. The method of claim 1 wherein said at least one conductive material comprises Cu or a Cu alloy.

13. The method of claim 9 wherein said noble metal cap and said surface repair material comprise a same material.

14. The method of claim 9 wherein said noble metal cap and said surface repair material comprise a different material and thus an interface is present between said noble metal cap and said surface repair material.

15. The method of claim 1 wherein said intentionally forming said hollow-metal related defects comprises utilizing hydrofluoric acid as a wet etchant.

16. The method of claim 1 wherein said at least one conductive material is of unitary construction and comprises a single conductive material selected from Cu, W, Al and a Cu—Al alloy.

* * * * *